(12) United States Patent
Aaltonen et al.

(10) Patent No.: US 7,836,321 B2
(45) Date of Patent: Nov. 16, 2010

(54) PORTABLE BATTERY DRIVEN APPARATUS

(75) Inventors: Janne La. Aaltonen, Turku (FI); Juha H. Salo, Littoinen (FI); Timo Lahnalampi, Salo (FI)

(73) Assignee: Nokia Corporation, Espoo (FI)

( * ) Notice: Subject to any disclaimer, the term of this patent is extended or adjusted under 35 U.S.C. 154(b) by 689 days.

(21) Appl. No.: 10/557,654

(22) PCT Filed: Jun. 28, 2004

(86) PCT No.: PCT/IB2004/051025
§ 371 (c)(1),
(2), (4) Date: Sep. 18, 2008

(87) PCT Pub. No.: WO2004/114639
PCT Pub. Date: Dec. 29, 2004

(65) Prior Publication Data
US 2009/0164823 A1   Jun. 25, 2009

(30) Foreign Application Priority Data
Jun. 26, 2003  (GB) ................................. 0314956.4

(51) Int. Cl.
*G06F 1/26* (2006.01)
*G06F 11/30* (2006.01)
(52) U.S. Cl. .................. 713/340; 713/300; 713/320; 713/323; 715/749
(58) Field of Classification Search .......... 713/300, 713/320, 323, 340; 715/749
See application file for complete search history.

(56) References Cited
U.S. PATENT DOCUMENTS

| 4,845,419 | A | | 7/1989 | Hacker |
| 5,530,335 | A | | 6/1996 | Decker et al. |
| 6,144,725 | A | * | 11/2000 | Kurosawa et al. ....... 379/100.05 |
| 6,459,175 | B1 | | 10/2002 | Potega |
| 6,464,317 | B2 | * | 10/2002 | Miyazawa .................... 347/14 |
| 6,577,338 | B1 | * | 6/2003 | Tanaka et al. ............ 348/207.2 |
| 6,918,645 | B2 | * | 7/2005 | Takahashi .................... 347/16 |
| 2004/0102228 | A1 | | 5/2004 | Hakamata et al. |

FOREIGN PATENT DOCUMENTS

WO   WO03009486   1/2003

OTHER PUBLICATIONS

PCT International Search Report (as published), International Application No. PCT/IB2004/051025, Date of Completion of Search—Oct. 25, 2004.

* cited by examiner

*Primary Examiner*—Thomas Lee
*Assistant Examiner*—Michael J Brown
(74) *Attorney, Agent, or Firm*—Locke Lord Bissell & Liddell LLP

(57) ABSTRACT

A mobile telephone handset (1) has its circuitry (11) to be driven by a rechargeable battery (17). The handset can to perform a data processing operation such as a download or a memory defragmentation, which requires battery power over a considerable period of time and a battery sensor (20) is coupled to the circuitry for indicating whether the battery has sufficient capability to complete the data operation. The circuitry (11) is configured to cease the data processing operation in the event that the battery is indicated to have insufficient capability to complete the operation. A battery charging sensor (19) indicates when an external battery charger is connected and the download or defragmention process is preferably carried out using the power of the charger rather than the battery.

12 Claims, 5 Drawing Sheets

PORTABLE BATTERY DRIVEN APPARATUS

FIELD OF THE INVENTION

This invention relates to a portable battery driven apparatus with improved operational management to take account of its battery resource, and has particular but not exclusive application to mobile telecommunications apparatus.

BACKGROUND OF THE INVENTION

The data memory capacity of portable battery driven apparatus such as mobile telephone handsets, has increased significantly and it is envisaged that mobile telephone handsets may have mass memories with a capacity of the order of Gbytes or more in due course. As a result, large amounts of data may be downloaded over the air to the handset for storage in its memory. However, the bandwidth of the mobile wireless network is limited so that the delivery of for example a 30 Mbyte file over a general packet radio system (GPRS) network typically would occur at 40 Kbit/sec and would take approximately 100 minutes. Thus, if the battery of the mobile handset has insufficient capability to support the download over this period, the downloading process will fail and battery resources will be wasted.

Also, the memory of the portable apparatus may become fragmented over time and so a defragmentation housekeeping routine should be carried out. As known in the art for computers, this involves a systematic scan of the memory to determine where various data blocks are loaded, so as to identify unused fragmented portions of the memory and then the data is reloaded into contiguous blocks so as to create unfragmented memory regions for future use. The defragmentation process can take a significant time, of the order of 15 minutes or more depending on the condition of the memory and if the battery has insufficient capacity to complete defragmentation process from beginning to end, the process will fail and will have to be started again from the beginning, wasting battery resources.

Also, with increased memory capacity in the portable apparatus, it becomes desirable to provide a memory backup to prevent accidental data loss, for example of digital photographs, videos and other data. One proposal is to upload the data from the portable apparatus over the air to a remote server in the Internet. The uploading uses up battery resources in a similar manner to the downloading of data and so if the battery has insufficient capacity to complete the upload, the uploading process will fail and waste battery resources.

The present invention seeks to overcome these problems.

SUMMARY OF THE INVENTION

According to the invention as provided a portable battery driven apparatus including: circuitry to be driven by a rechargeable battery to perform a data processing operation, and a battery sensor coupled to the circuitry for indicating whether the battery has sufficient capability to complete the data operation, the circuitry being configured to cease the data processing operation in the event that the battery is indicated to have insufficient capability to complete said operation.

Thus, in accordance with the invention, a data processing operation, such as a download, upload or a defragmentation process, is ceased in the event that the battery has insufficient capability to complete the operation, without necessarily allowing the operation to run down the battery charge completely.

The invention also includes a portable battery driven apparatus including: circuitry to be driven by a rechargeable battery or by an external source of power that recharges the battery, to perform selectable data operations, at least one of the operations requiring higher battery capacity than others thereof, and a charging sensor operable to sense when the external power source is connected to the apparatus to recharge the battery, the circuitry being responsive to the charging sensor for performing said at least one higher battery capacity requirement data operation in response to the external power source being connected to the apparatus.

The invention further includes a portable battery driven apparatus including: circuitry to be driven by a rechargeable battery, to perform selectable data operations, at least one of the operations requiring higher battery capacity than another thereof, and a charging sensor operable to sense when the external power source is connected to the apparatus to recharge the battery, the circuitry being responsive to the charging sensor for performing said at least one higher battery capacity requirement data operation powered by the external power source when connected to the apparatus rather than the rechargeable battery.

BRIEF DESCRIPTION OF THE DRAWINGS

In another aspect the invention includes a method of downloading data from a server to a battery driven portable apparatus, comprising, determining if the battery has a sufficient level of charge to process the download, and if not, signalling to the server that the download is to be aborted, the server logging that the download was aborted due to insufficient battery charge level.

In yet another aspect the invention includes a method of uploading data for example back up of user data, from a battery driven portable apparatus to server, comprising, determining if the battery has a sufficient level of charge to process the upload, and if not, signalling to the server that the upload is to be aborted, the server logging that the download was aborted due to insufficient battery charge level and indicating to end user that the back up is incomplete.

Figure 1:
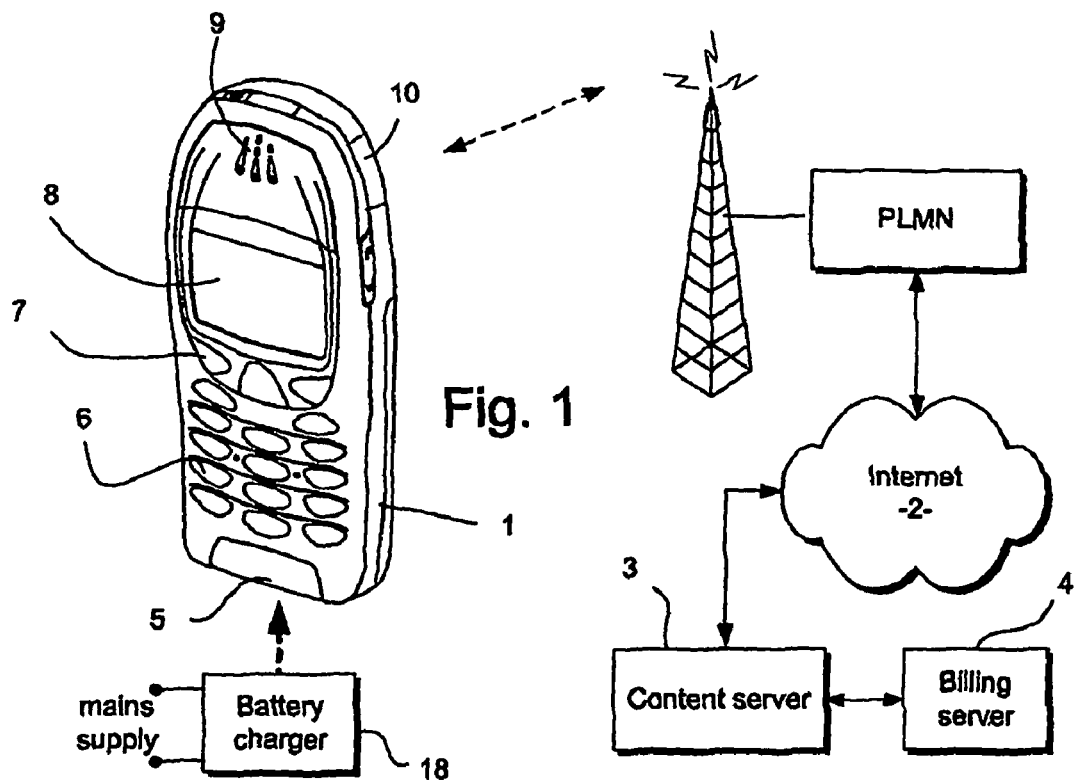
Figure 2:
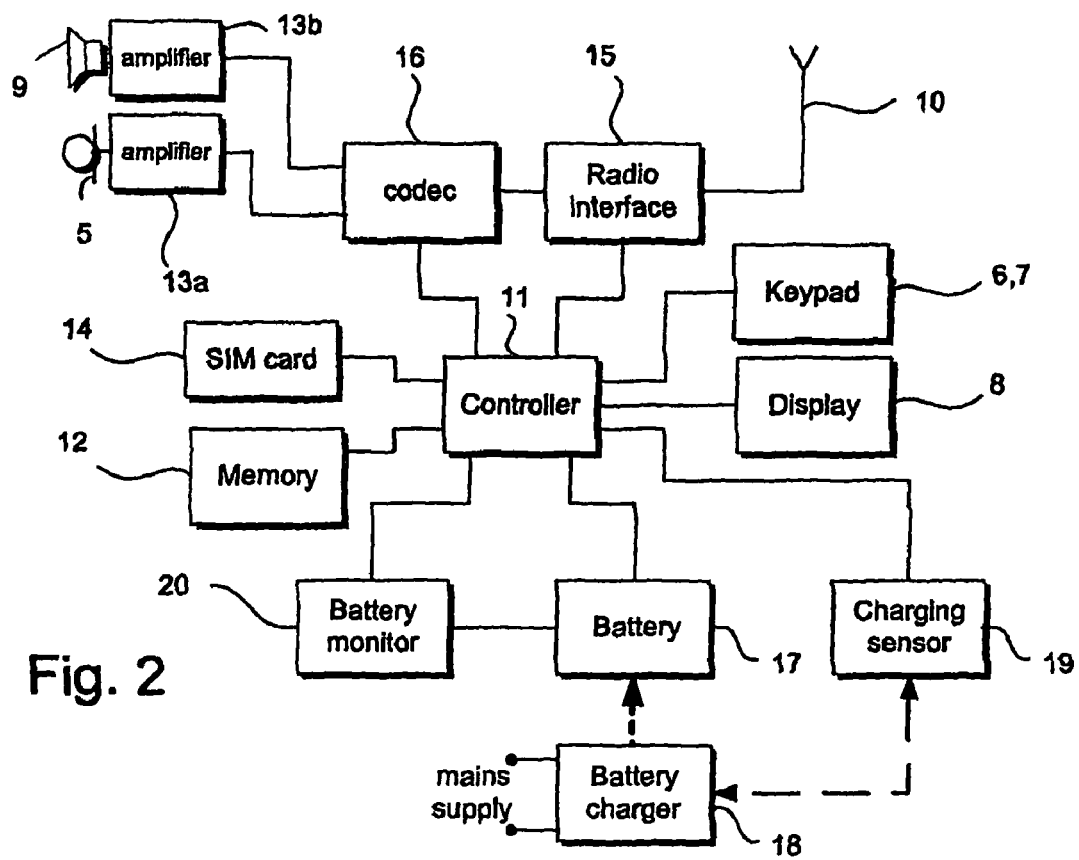
Figure 3:
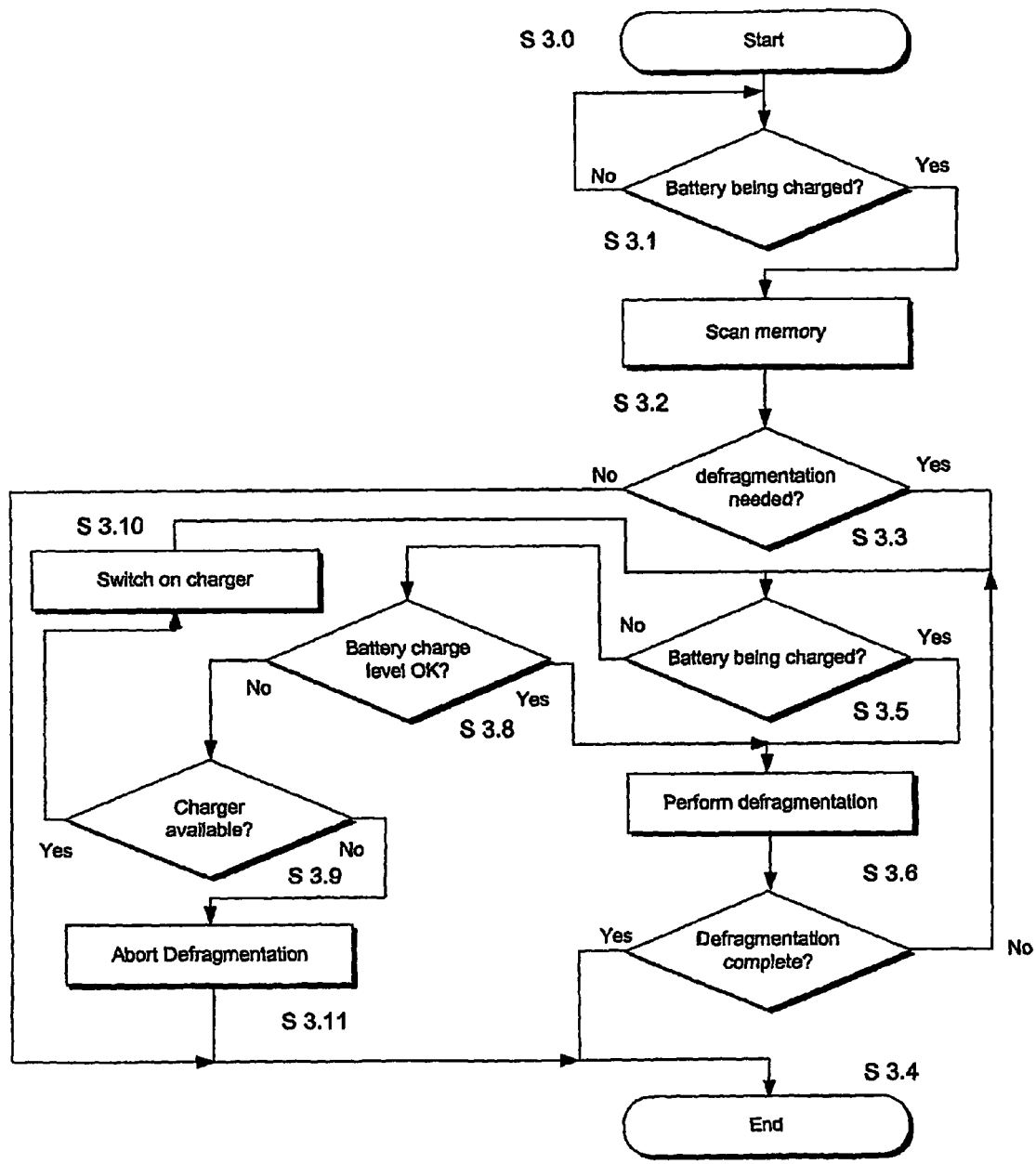
Figure 4:
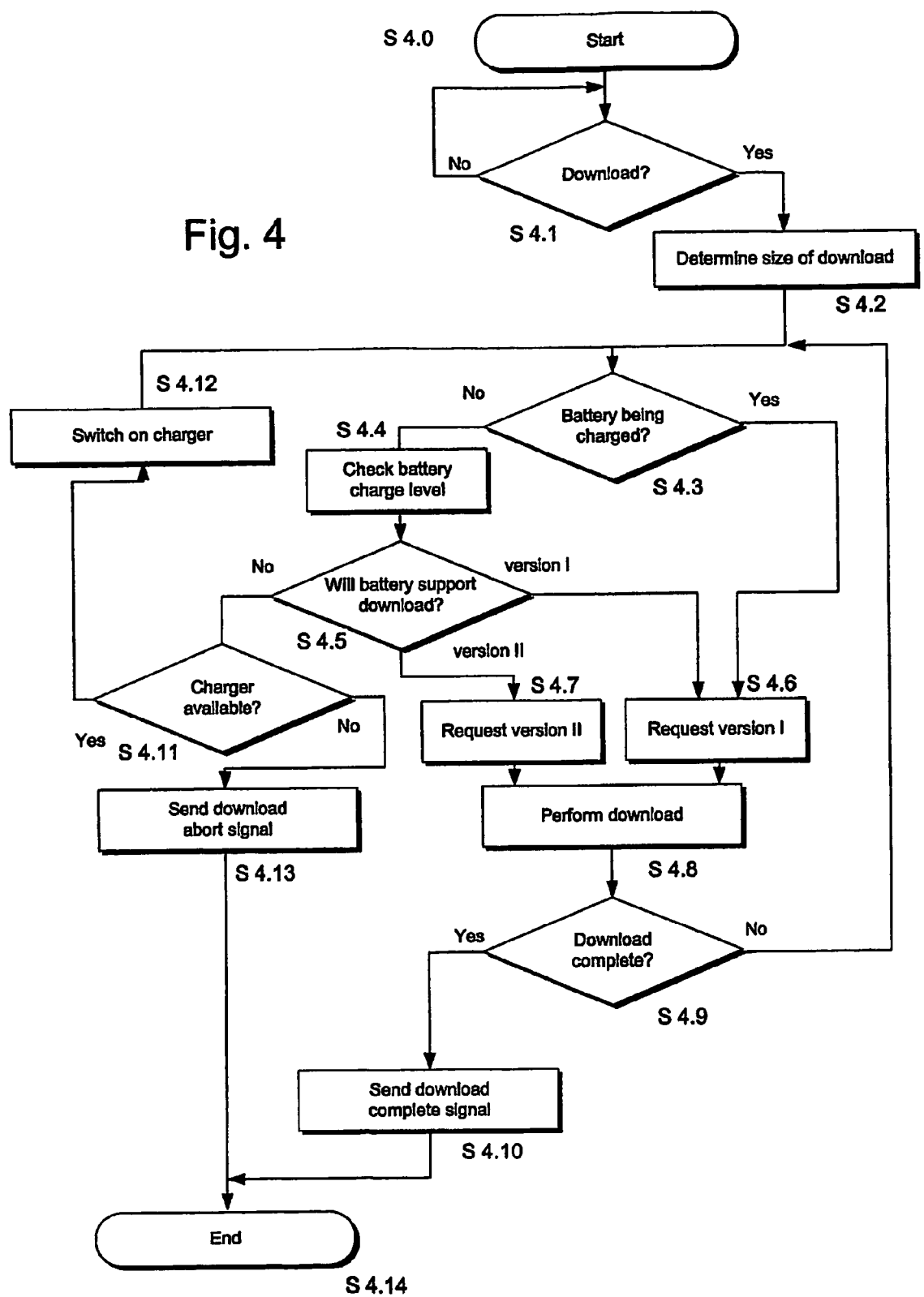
Figure 5A:
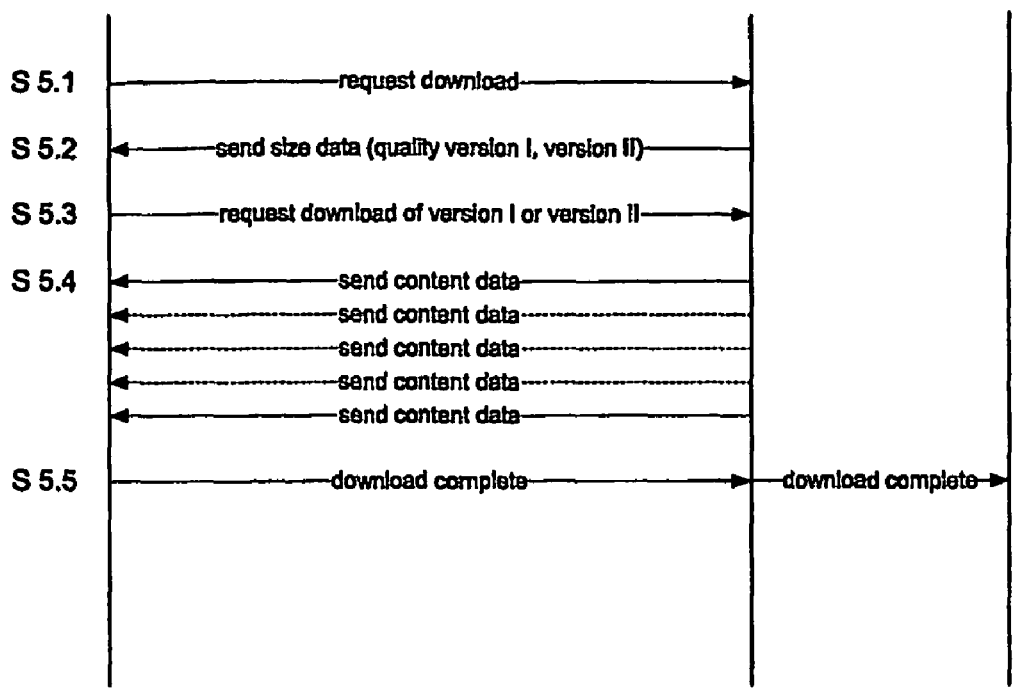
Figure 5B:
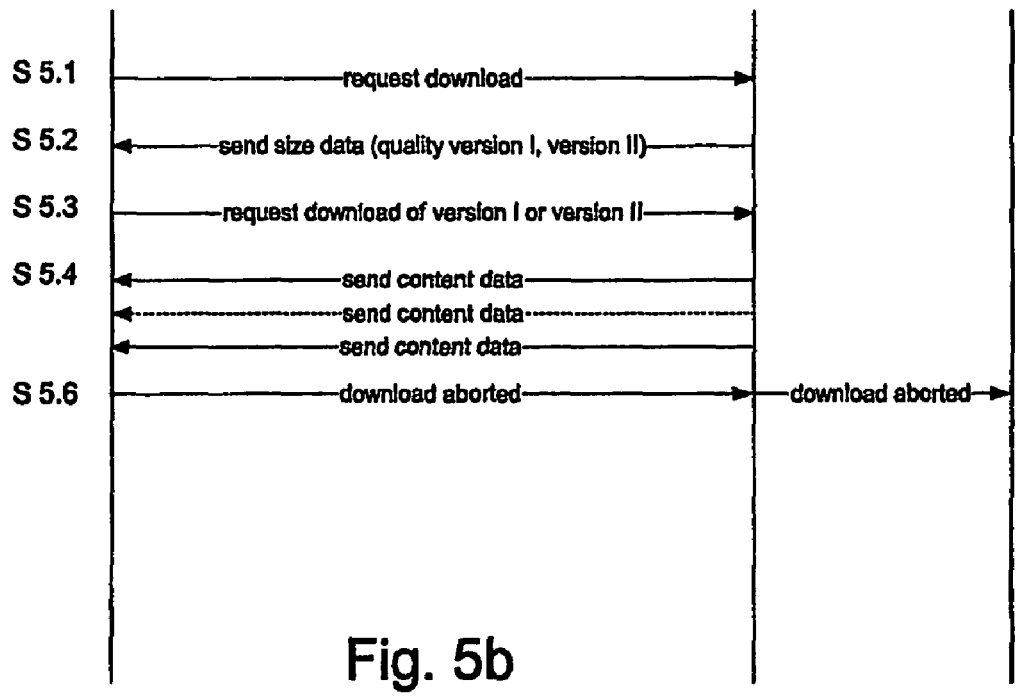
Figure 6:
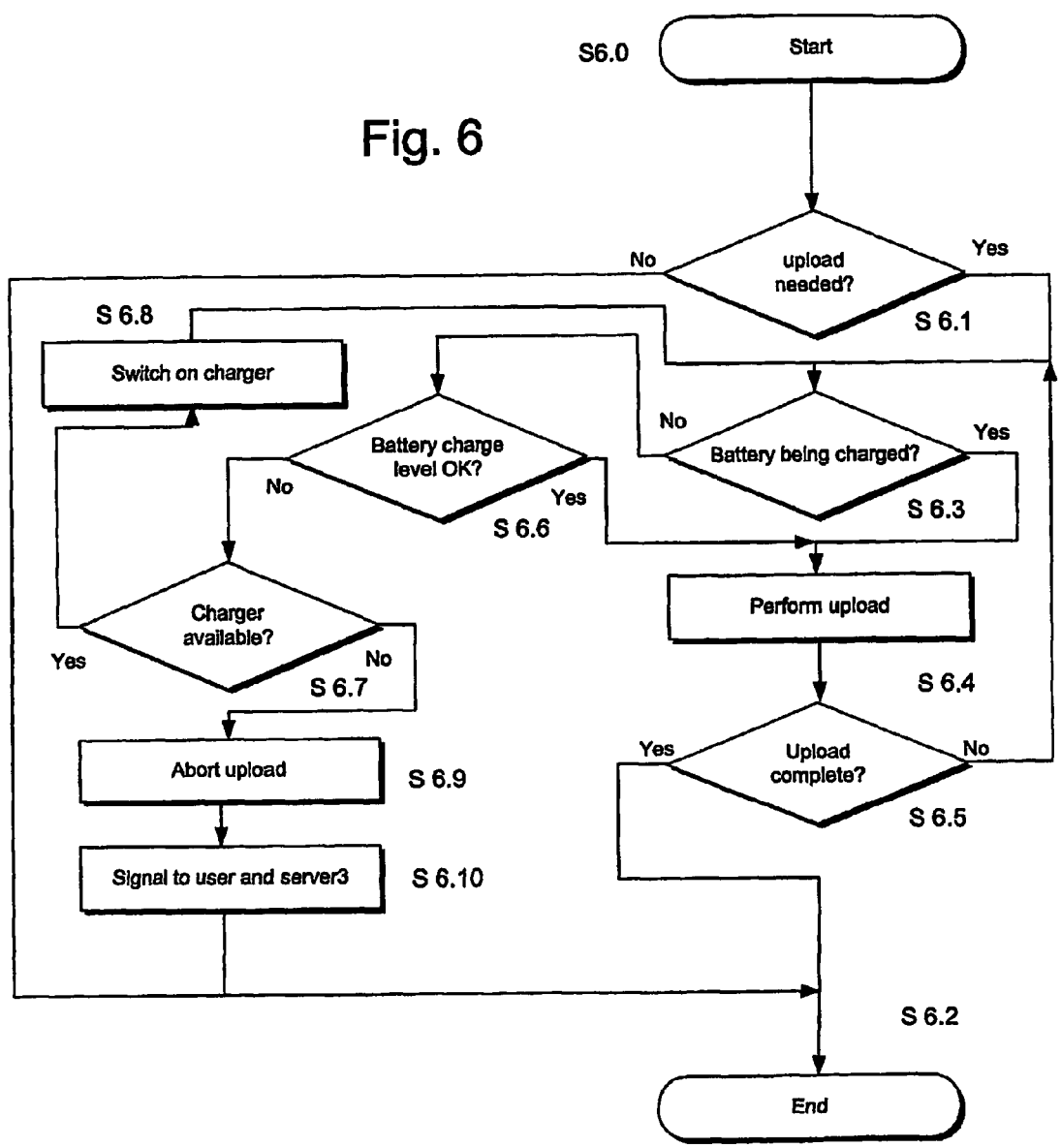

In order that the invention may be more fully understood, an embodiment thereof will now be described by way of example with reference to the accompanying drawings in which:

FIG. 1 is a schematic block diagram illustrating a mobile telephone handset which communicates through a cellular wireless mobile telephone network to a server connected through the Internet;

FIG. 2 is a schematic block diagram of the circuitry of the mobile handset shown in FIG. 1;

FIG. 3 illustrates a process performed by the processor of the mobile handset to perform a memory defragmentation process;

FIG. 4 is a schematic flow diagram of a process performed by the processor of the handset to download data contents from a remote server, over the air through the mobile network;

FIG. 5a illustrates the data flows that occur during a successful download;

FIG. 5b illustrates the data flows that occur during an unsuccessful download, and FIG. 6 illustrates a process performed by the processor of the mobile handset to perform an upload for a memory back-up process.

DETAILED DESCRIPTION

In FIG. 1, a mobile station in the form of a mobile telephone handset 1 communicates over the air with a cellular public land mobile network (PLMN) which is connected through a network 2, such as the Internet to a content server 3 that can download data content to the mobile handset 1. The content server 3 has an associated billing server 4 for billing the subscriber for downloaded content.

The handset 1 includes a microphone 5, keypad 6, soft keys 7, a liquid crystal display (LCD) 8, earpiece 9 and internal antenna 10. The handset 1 is enabled both for voice and data operations. For example, the handset may be configured for use with a GSM network and may be enabled for wireless application protocol (WAP) operation although those skilled in the art will realise other networks and signal communication protocols can be used. Signal processing is carried out under the control of a digital micro-controller 11 which has an associated memory 12 that comprises a non-volatile, solid state memory of relatively large capacity of the order of Gbytes in order to receive data downloads from the content server 3, such a video clips and the like. Electrical analog audio signals are produced by microphone 5 and amplified by preamplifier 13a. Similarly, analog audio signals are fed to the earpiece 9 through an amplifier 13b. The micro-controller 11 receives instruction signals from the keypad and soft keys 6, 7 and controls operation of the LCD display 8. Information concerning the identity of the user is held on removable smart card 14, in the form of a GSM SIM card that contains the usual GSM international mobile subscriber identity and encryption key $K_i$ that is used for encoding the radio transmission in a manner well known per se. Radio signals are transmitted and received by means of the antenna 10 connected through a rf stage 15 to a codec 16 configured to process signals under the control of micro-controller 11. Thus, in use, for speech, the codec 16 receives analog signals from microphone amplifier 13a, digitises them into a form suitable for transmission and feeds them to the rf stage 15 for transmission through the antenna 10 to the PLMN shown in FIG. 1. Similarly, signals received from the PLMN are fed through the antenna 10 to be demodulated by the rf stage 15 and fed to codec 16 so as to produce analog signals fed to the amplifier 13a and earpiece 9.

The handset is WAP enabled and capable of receiving data for example, over a GPRS channel at a rate of the order of 40 Kbit/sec. It will however be understood that the invention is not restricted to any particular data rate or data transport mechanism and for example WCDMA, CDMA, GPRS, EDGE, WLAN, BT, DVB-T, IPDC, DAB, ISDB-T, ATSC, MMS, TCP/IP, UDP/IP or IP, systems could be used.

The handset 1 is driven by a conventional rechargeable battery 17 that can be recharged by an external battery charger 18, which may be driven by a conventional mains supply. The charger 18 can be plugged into the battery 17 when recharging is required. As known in the art, the battery charger may include a cradle (not shown) into which the telephone handset 1 is received, which has electrical contacts for supplying a charging current to the battery 17.

A charging sensor 19 is connected to the micro-controller 11 to indicate when the battery charger is connected and/or supplying a charging current to the battery 17. The charger 18 may be configured to charge the battery 17 when its charge is depleted and thereafter when fully charged, to switch to a sleep mode in which no charging takes place, until the user re-activates the charging process.

The charging condition of the battery is monitored by a battery monitor 20 which can monitor the battery voltage and/or the current delivered by the battery 17.

When the battery 17 is being charged by the charger 18, the circuits of the handset 1 receive voltage from the charger 18, which acts in the manner of continuous, external power supply irrespective of the level of charge in the battery 17.

A user of handset 1 can request the downloading of data content from one or more servers such as server 3, for example to download video clips and the like to be replayed and displayed on the display 7. Such downloaded video clips are stored in the memory 12. Also, other data files of differing sizes may be downloaded and stored in the memory 12. The user may delete some of the files over time when they are no longer wanted. As a result, the memory 12 becomes fragmented and a defragmentation process may need to be carried out. As known in the art, memory defragmentation is a processor-intensive operation that takes typically 15 minutes or more depending on how fragmented the memory storage has become.

FIG. 3 illustrates a defragmentation process performed by the micro-controller 10 to defragment memory 12, in which the process is aborted in the event that the battery 17 has insufficient capability to complete the defragmentation operation completely. The process starts at step S3.0 and in a preliminary step S3.1, the controller 11 checks the signal from charging sensor 19 to determine if the battery is being charged by the battery charger 18. If so, the circuitry shown in FIG. 2 will be powered by the low voltage supply developed by the battery charger 18 irrespective of the state of charge of the battery 17 and so a long data processing operation such as defragmentation can be safely carried out whilst the charger is operative.

Alternatively, the step S3.1 can be omitted and the fragmentation process performed either on demand by the user or periodically under the control of the micro-controller 11.

In step S3.2, a preliminary scan of the memory 12 is carried out to determine the degree of defragmentation of stored data in the memory. As previously explained, the various data files loaded in the memory may result in a number of discontinuous memory areas that cannot be readily used and so a reorganisation or defragmentation of the stored data may be needed in order to release the unused memory space for efficient use in the future.

At step S3.3 a determination is made as to whether defragmentation is needed i.e. whether the memory space will be freed-up effectively by reorganising the locations of stored data within the memory. If no defragmentation is needed, the process terminates at step S3.4. However, if defragmentation is needed, a check is carried out at step S3.5 to determine if the battery 17 is being charged by charger 18. If so, the battery charger 18 will act as a continuous power supply irrespective of the level of charge of the battery 17 and so it is safe to perform the defragmentation process, which is carried out at step S3.6. As well known in the art, this involves rearranging the memory storage locations of stored data content so that the files are held in contiguous memory storage locations thereby, releasing fragmented memory areas and creating an unused area for future use. The defragmentation process involves many processing steps and may take 15 minutes or longer depending on the degree of defragmentation of the stored data and the number of steps required to move the data to achieve a substantially contiguous use of memory locations within the memory 12. Completion of the defragmentation process is tested at step S3.7, and until it is completed the battery charging is continuously checked at step S3.5 to determine that the battery charger 18 is still connected.

If for some reason the battery charger 18 becomes disconnected (or in the event that step S3.1 was not used to trigger the defragmentation and the battery charger 18 was not connected in the first place) the defragmentation needs to be carried out using power from the battery 17. The charge level of the battery 17 is checked using battery monitor 20 at step S3.8 in order to determine whether the battery has sufficient capacity to carry out the defragmentation process completely. If the outcome of test S3.8 indicates a satisfactory level of battery charge then the defragmentation process goes forward at step S3.6. However, if the test S3.8 indicates insufficient battery charge then the micro-controller 11 checks the charging sensor 19 at step S3.9 to determine whether the battery charger 18 is available for use. More particularly, the battery charger 18 may be physically connected to the battery 17, for example the handset 1 being placed in a cradle of the battery charger but the circuitry of the battery charger 18 may be in the aforementioned sleep mode where no charge is being delivered for recharging the battery. If this is the case, the battery charger is switched from its sleep mode into the battery charging mode at step S3.10, and the battery charger 18 becomes operative as a power supply to support the defragmentation process. The operative state of the battery charger 18 is then detected at step S3.5 and the defragmentation process goes forward at step S3.6 as previously described.

However, if the battery charger 18 is not available, for example when the handset 1 is removed from the cradle, the defragmentation routine is aborted at step S3.11 because the battery 17 has insufficient charge to complete the defragmentation process completely.

The battery monitor 20 can operate in a number of different ways in order to estimate the charge capacity of the battery and determine whether it will support the complete defragmentation operation. For example, the controller 11 and battery monitor 20 may operate in the manner described in our U.S. Pat. No. 5,844,884, in which successive battery voltage samples are taken over time and used in a computation process to compute the standby time for the battery during the idle mode i.e. when no calls are being made. The controller 11 models the discharge characteristics of the battery and then estimates from the voltage measurements the operational time of the battery on the basis of a particular level of current consumption appropriate for the defragmentation process.

FIGS. 4 and 5 illustrate a process for downloading data content from the server 3 shown in FIG. 1. The data content is relatively large and may take of the order of 20-30 minutes to download. The micro-controller 11 of the handset 1 is configured to abort the download in the event that the battery is determined to have insufficient capacity to complete the download, thereby conserving battery power that would otherwise by unnecessarily used up in a fruitless download process.

The process starts at step S4.0 and a download request from a user of the handset 1 is detected at step S4.1. At step S4.2, the size of the download is determined i.e. the size of the data file to be downloaded from server 3. As shown in FIG. 5*a,* this can be achieved by the handset 1 sending a download request at step S5.1 to the content server 3, which in turn sends data size information to the handset 1 at step S5.2.

The requested content may be available in different versions i.e. version I or version II that contain the same overall data but of different qualities. For example a video clip may be available in version I in a high quality high resolution and in version II as a lower quality version of the clip of a lower resolution. Version I has a larger file size than version II and therefore takes longer to download.

Referring again to FIG. 4, the micro-controller 11 checks at step S4.3 whether the battery is being charged by the battery charger 18, by checking data from the charging sensor 19. In the event that the battery is being charged, the battery charger 18 acts as a power supply for the mobile handset 1 irrespective of the level of charge in the battery 17 and so the download can be performed safely. Furthermore, the download can be performed in version I of high quality.

However, if the battery 17 is not being charged, the processor checks at step S4.4 the charge level of the battery and at step S4.5 determines whether the battery will support the size of the file to be downloaded either in version I or version II. If the battery has sufficient charge to support version I in high quality, then version I is requested at step S4.6. Similarly, if the battery is being charged as detected at step S4.3, then version I is requested at step S4.6. However, if the battery will only support downloading of version II, version II is requested at step S4.7. The version requests S4.6, S4.7 are illustrated in FIG. 5*a* as step S5.3.

Then, at step S4.8, the data content is downloaded. This is also illustrated at step S5.4 in FIG. 5*a*.

Completion of the download is checked at step S4.9 and when completed, a download complete signal is set is step S4.10 to the content server 3 as illustrated at step S5.5 in FIG. 5*a*. The download complete signal is passed by the content server 3 to the billing server 4 so that the subscriber can be charged for the downloaded data.

Referring again to step S4.9, until the download is complete, the battery charge condition is checked at step S4.3.

Referring again to step S4.5, in the event that the battery 17 is being used to support the downloading process and the battery will not support the downloading of either version I or version II, then a determination is made at step S4.11 as to whether the charger 18 is available and in the sleep mode. If so, the charger is switched on at step S4.12 so that, with the battery being charged (step S4.3) version I of the download can be requested at step S4.6 as previously described.

However, if the charger 18 is not available in its sleep mode i.e. when the charger is disconnected, a download abort signal is sent by the handset 1 to the content server 3, at step S4.13. Thus, if a download is commenced in either version I or version II and subsequently it is found that the battery will not support the download in the selected version I or II, and the charger 18 is not available to take over from the battery 17, then the downloading process is immediately aborted to avoid further unwanted use of battery power in a fruitless downloading operation which cannot be completed. FIG. 5*b* illustrates then sending of the download abort signal at step S5.6. It will be understood that the sequence of events in FIG. 5*b* are the same as those of FIG. 5*a* except for the sending of the abort signal at step S5.6 instead of the download complete signal at step S5.5 in FIG. 5*a*. Thus, the downloading is interrupted before the battery power is completely depleted. The download abort signal S5.6 is passed by the content server 3 to the billing server 4 and the resulting financial charge to the subscriber may be modified to take account of the fact that the download was not completed. For example, a reduced charge or no charge may be made for the aborted download.

Also, the download abort signal generated at step S4.13 may be used to provide an alarm signal on the display 7 of the handset 1 e.g. "The download has been terminated due to insufficient battery power".

In the event that the charger 18 is connected and then becomes disconnected during the download, before it is complete as determined at step S4.9, then the battery level is checked at step S4.4 and if it is capable of supporting the download, as determined at step S4.5, the download will continue under battery power, but otherwise the downloading process will terminate as previously described.

One advantage of the described system is that if, during the download, it is found that the battery will not support the high quality version I, but would support version II, then the download can switch to version II for completion of the download.

With regard to the checking of the battery level at step S4.4 and S4.5, the battery charge level can be computed as previously described in relation to U.S. Pat. No. 5,844,884 and then the computed operational life of the battery in a dedicated mode can be compared with the time required to download the requested content as determined at step S4.2. Also, similar power consumption estimates can be performed on the basis of the power consumption that occurs during the downloading of content. Under poor downloading conditions, a much higher current is used than under good or excellent downloading radio conditions. This crude information can be used to make a rough estimate of whether there is sufficient battery life to complete the download. The processor may with time teach itself a relationship between current consumption and battery life in order to improve the battery life estimate. Thus, the micro-controller 11 may run an algorithm to estimate battery capability on the basis of the following factors:

a) information about the signal quality/strength;
b) the history associated with previous downloads or other battery driven operations such as defragmentation processes, in respect of the amount of energy needed in different operating environments to perform the operation concerned; and
c) the battery age, since its capability to deliver current degrades over time.

The algorithm can be calibrated on the basis of factors a) b) and c).

The different versions of the data content i.e. version I and II can have a large impact on the time taken to complete a download. In a specific example, for version I, the quality of the audio visual stream is 90 Kb/sec, the length of the video clip is 10 minutes and the available bit rate through the mobile network is 30 Kb/sec, which is a typical value for a GPRS communication link, and the download time is of the order of 30 minutes for the clip. However, if the battery level is such that the communication channel can only be kept open for 15 minutes then if the version II has an audio visual stream quality of 45 Kb/sec the version II quality can be downloaded within the available time of 15 minutes.

In a modification to the described downloading procedure, the two versions of the data may have different lengths rather than different qualities. Thus, for example version I may be a full length version of a video clip whereas version II may be edited highlights in order to provide a reduced download time.

In a further modification, version I may be a full version and version II a predetermined portion of version I e.g. 70% of version I. In this modification, the battery check performed at step S4.5 may determine whether the battery can support downloading version II and may actually specify the percentage to be used for version II i.e. version II is to be x % of version I depending on the battery capacity, and to communicate this percentage to the server 3. Version II can then be downloaded as previously described, and when the battery 17 becomes recharged at a later time, the remainder of version I that was omitted from version II can be downloaded. The user may be provided with a notification on display 8 such as "Only part of the data was downloaded—please recharge the battery".

The downloading described so far is a so-called "pull" in which the handset 1 acts as a client for the server 3 and the handset requests the downloading of the data content. However, the download can also be initiated by a "push" in which the server 3 initiates the downloading process. In the case of a push, the server 3 will send a push signal to the handset 1 that includes data corresponding to the size of the data content to be downloaded. The handset 1 responds by testing the capacity of the battery 17 and reporting to the server 3 whether it has the battery capacity to support the downloading of the data content and also if version I or version II can be supported. The downloading of the appropriate version then proceeds and the battery is monitored during the downloading process as previously described with reference to FIG. 4.

FIG. 6 illustrates a process performed by the micro-controller 10 to upload the contents of the memory 12 to the server 3 to provide a back-up of videos, digital photographs and the like that are stored by the subscriber in the handset. According to the invention the uploading process is aborted in the event that the battery 17 has insufficient capability to complete the uploading operation completely.

The process starts at step S6.0 and at step S6.1 a check is made to determine if to an upload has been requested. This can either be a request made by the subscriber, a periodic request generated by the micro-controller 11 as part of its general housekeeping routine, or in response to charging sensor 19 detecting that the handset 1 has been connected to the charger 18. Also, the back-up may be requested by the server 3. If no upload is needed, the process terminates at step S6.2. However, if upload is requested, a check is carried out at step S6.3 to determine if the battery 17 is being charged by charger 18. If so, the battery charger 18 will act as a continuous power supply irrespective of the level of charge of the battery 17 and so it is safe to perform the upload process, which is carried out at step S6.4.

The upload process involves transmitting the contents of the memory 12 to a subscriber-specific memory location in the server 3. The uploading may take 30-40 minutes or longer depending on the amount of data stored in the memory 12. Completion of the uploading process is tested at step S6.5, and until it is completed the battery charging is continuously checked at step S6.3 to determine that the battery charger 18 is still connected.

If for some reason the battery charger 18 becomes disconnected, or if it was not connected in the first place, the uploading needs to be carried out using power from the battery 17. The charge level of the battery 17 is checked using battery monitor 20 at step S6.6 in order to determine whether the battery has sufficient capacity to carry out the uploading process completely. This may involve the controller 11 checking the amount of data stored in the memory 12 to be uploaded and comparing the upload time for the data with the operational time for the battery computed as described previously. If the outcome of test S6.6 indicates a satisfactory level of battery charge then the uploading process goes forward at step S6.4. However, if the test S6.6 indicates insufficient battery charge then the micro-controller 11 checks the charging sensor 19 at step S6.7 to determine whether the battery charger 18 is available for use, as previously described with reference to FIG. 3. If this is the case, the battery charger is switched from its sleep mode into the battery charging mode at step S6.8, and to the battery charger 18 becomes operative as a power supply to support the data uploading process. The operative state of the battery charger 18 is then detected at step S6.3 and the uploading process goes forward at step S6.4 as previously described.

However, if the battery charger 18 is not available, for example when the handset 1 is removed from the cradle, the uploading is aborted at step S6.9 because the battery 17 has insufficient charge to complete the defragmentation process completely. The termination of the memory back-up process may be signalled at step S6.10 to the user of the handset by a message on the display 8, such as "Memory back-up failed due to lack of battery power—please charge the battery." Also a message is transmitted at step S6.10 to the server 3 in order to signal that the upload has been aborted.

Many other modifications and variations of the described system are possible. For example whilst the invention has been described in relation to a mobile telecommunications handset, it is applicable to other apparatus driven by rechargeable batteries such as laptops and PDAs.

Also, whilst the downloading has been described in terms of a cellular mobile network from server 3, other servers could be used, for example a set top box or personal computer which can be accessed by the portable apparatus through local connectivity such as Bluetooth, infra-red, wireless LAN or the like.

The invention claimed is:

1. An apparatus, comprising:
   circuitry to be driven by a rechargeable battery to perform a data processing operation including downloading data content, the data content being configured in a first relatively large size and a second relatively small size, and
   a battery sensor coupled to the circuitry, the battery sensor being configured to indicate whether the battery has sufficient capability to complete the operation of downloading of the data content,
   the apparatus being configured to obtain data corresponding to the size of the content to be downloaded,
   wherein said circuitry is configured to estimate whether the battery has the capability to support the downloading of the content in said first size, and if it is estimated that the battery does not have the capability to support the downloading of the content in said first size, to estimate whether the battery has the capability to support the downloading of the content in said second size, and the circuitry is configured to cease the downloading of the data content in the event that the battery is indicated to have insufficient capability to complete the downloading of the data content.

2. An apparatus as claimed in claim 1 wherein the circuitry is configured to cease the downloading of the data content after it has started in the event that the battery is indicated to have insufficient capability to complete said operation.

3. An apparatus according to claim 1 wherein said first size is of a relatively high quality and the second size is of a relatively low quality.

4. An apparatus according to claim 1 wherein said first size is of a relatively long play duration and the second size is of a relatively short play duration.

5. An apparatus according to claim 1 wherein the battery sensor coupled to the circuitry is configured to indicate whether the battery has sufficient charge to complete the data operation.

6. An apparatus according to claim 1 wherein the battery sensor is operable configured to detect at least one of the voltage of the battery and the current delivered by the battery.

7. An apparatus according to claim 1 wherein the battery sensor is configured to sense the condition of the battery continuously.

8. An apparatus according to claim 1 wherein the battery sensor is configured to sense the condition of the battery intermittently.

9. An apparatus according to claim 1 including an alarm configured to alert a user that the battery has insufficient charge to complete the data processing operation in advance of it being determined that the battery has insufficient capacity to support the data processing operation.

10. An apparatus according to claim 1, further comprising a mobile telecommunications handset.

11. A method, comprising:
    performing by circuitry driven by a rechargeable battery a data processing operation including downloading data content, the data content being configured in a first relatively large size and a second relatively small size;
    indicating by a battery sensor coupled to the circuitry whether the battery has sufficient capability to complete the downloading of the data content;
    obtaining data corresponding to the size of the content to be downloaded;
    estimating whether the battery has the capability to support the downloading of the content in said first size, and if it is estimated that the battery does not have the capability to support the downloading of the content in said first size, estimating whether the battery has the capability to support the downloading of the content in said second size; and
    ceasing the downloading of the data content in the event that the battery is indicated to have insufficient capability to complete the downloading of the data content.

12. A method as claimed in claim 11, further comprising:
    if the battery does not have sufficient capability to complete the downloading of the data content, signalling to a server that the download is to be aborted, and the server logging that the download was aborted due to insufficient battery charge level.

* * * * *